United States Patent [19]
Arndt et al.

[11] Patent Number: 6,037,648
[45] Date of Patent: Mar. 14, 2000

[54] SEMICONDUCTOR STRUCTURE INCLUDING A CONDUCTIVE FUSE AND PROCESS FOR FABRICATION THEREOF

[75] Inventors: Kenneth C. Arndt, Wappingers Falls, N.Y.; Jeffrey P. Gambino, Gaylordsville, Conn.; Jack A. Mandelman, Stormville, N.Y.; Chandrasekhar Narayan, Hopewell Junction, N.Y.; Rainer F. Schnabel, Wappingers Falls, N.Y.; Ronald J. Schutz, Millbrook, N.Y.; Dirk Többen, Fishkill, N.Y.

[73] Assignees: International Business Machines Corporation, Armonk, N.Y.; Infineon Technologies Corporation, San Jose, Calif.

[21] Appl. No.: 09/105,647

[22] Filed: Jun. 26, 1998

[51] Int. Cl.⁷ .................................................... H01L 29/00
[52] U.S. Cl. ............................................................. 257/529
[58] Field of Search ...................................... 257/529, 530

[56] References Cited

U.S. PATENT DOCUMENTS

| | | |
|---|---|---|
| 5,444,012 | 8/1995 | Yoshizumi et al. . |
| 5,550,399 | 8/1996 | Okazaki . |
| 5,578,517 | 11/1996 | Yoo et al. . |
| 5,723,358 | 3/1998 | Manley . |
| 5,789,794 | 8/1998 | Froehner . |
| 5,872,390 | 2/1999 | Lee et al. . |

*Primary Examiner*—Stephen D. Meier
*Attorney, Agent, or Firm*—Pollock, Vande Sande & Amernick; Steven Capella

[57] ABSTRACT

A semiconductor structure comprising a semiconductor substrate, an electrically conductive level on the substrate and a metal fuse located at the conductive level wherein the fuse comprises a self-aligned dielectric etch stop layer thereon is provided along with processes for its fabrication.

9 Claims, 4 Drawing Sheets

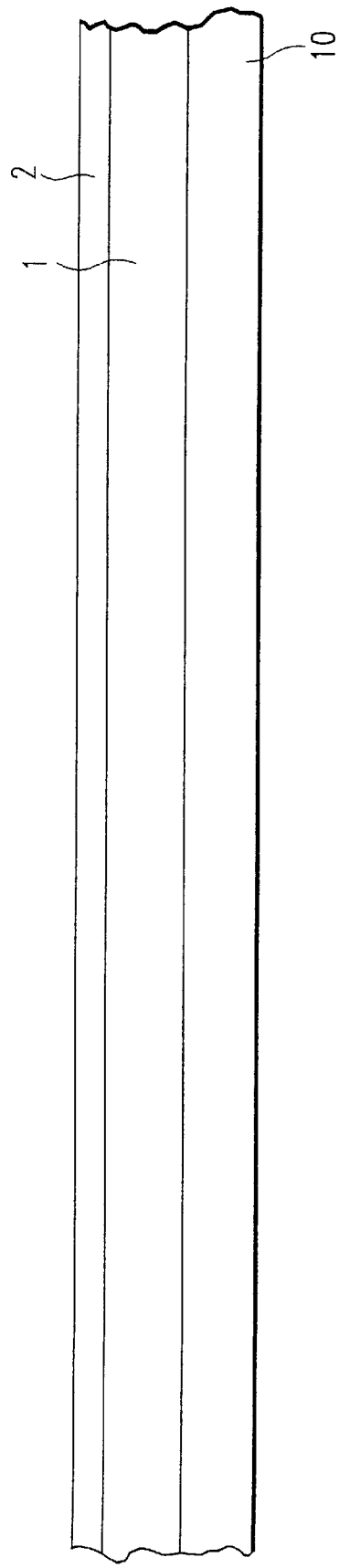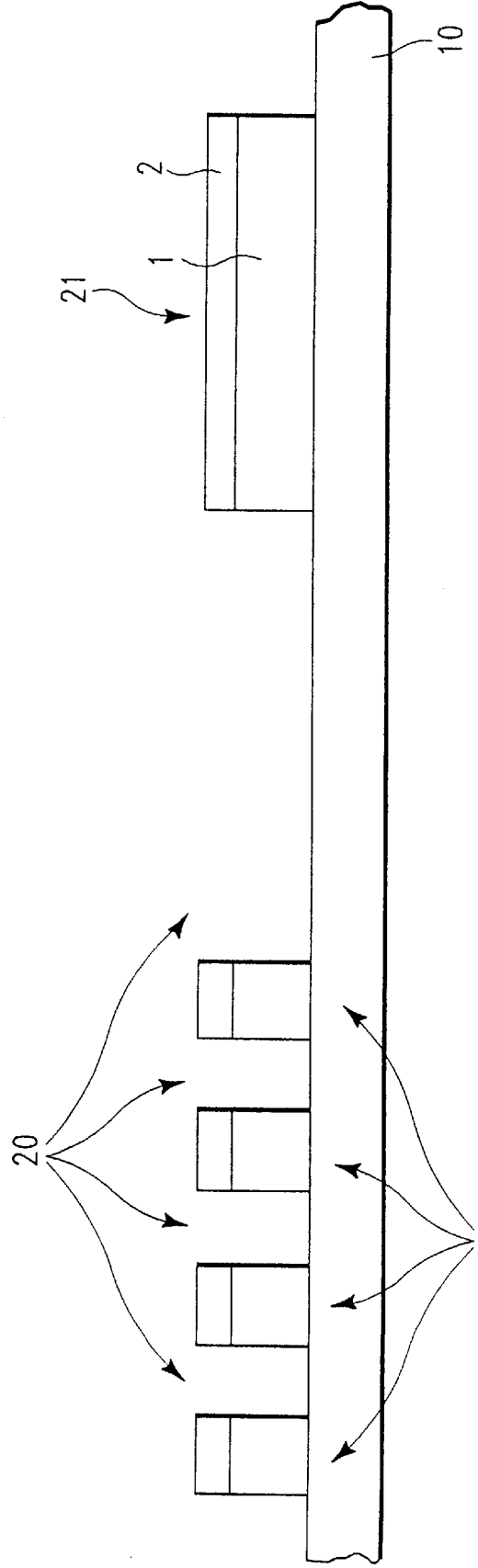

SEMICONDUCTOR STRUCTURE INCLUDING A CONDUCTIVE FUSE AND PROCESS FOR FABRICATION THEREOF

TECHNICAL FIELD

The present invention is concerned with a semiconductor structure that includes a conductive fuse, and more particularly relates to providing a conductive fuse having a self-aligned isolation cap thereon. In addition, the present invention relates to a fabrication process for achieving the desired structure. The fabrication process of the present invention makes it possible to provide a well controlled relatively thin dielectric layer over the fuse which is self-aligned to the fuse.

BACKGROUND OF INVENTION

Many integrated circuits such as dynamic random access memory (DRAM) and static random access memory (SRAM) employ fuses. Such can provide for redundancy for the purpose of preventing reduction of yield of the semiconductor devices which may be caused by random defects generated in the manufacturing process. The redundant circuit portion is provided as a spare circuit portion having the same function as a specific circuit portion so that the specific circuit portion which has a defect caused during manufacturing may be replaced with the redundant circuit in order to maintain the function of the entire semiconductor. Moreover, fuse links provide for voltage options, packaging pin out options, or any other option desired by the manufacturer to be employed prior to the final processing. This helps increase yield and makes it easier to use one basic design for several different end products.

One problem associated with fuse structures is that the thickness of the insulating layer over the fuse tends to have very large variation. The large variation in the final insulation thickness is due to variations in the deposition of isolation between a first and a second conductive level, variations in deposition of the next-to-last insulation layers, non-uniformities during chemical-mechanical polishing and variations in the reactive ion etching to achieve the final thickness. Accordingly, the thickness variation occurs because of the cumulative variations of each of the process steps even when each individual step can be reasonably controlled. The variation in thickness in turn limits the fuse pitch to that which corresponds to the largest isolation layer generated by the processing. However, it would be desirable to be able to reduce the pitch as well as controlling its thickness as much as possible. Such a control would permit reducing the fuse pitch and providing more redundancy to memory products.

SUMMARY OF INVENTION

The present invention relates to improving the control of the thickness of the insulating layer above a fuse structure. Moreover, the present invention makes possible a fuse structure having a relatively thin self-aligned dielectric layer.

In one aspect, the invention is concerned with a semiconductor structure comprising a semiconductor substrate, an electrically conductive level on the substrate and a fuse located at this conductive level. The fuse comprises a self-aligned dielectric etch stop layer thereon. An insulation structure is provided located above the conductive level, but not above the fuse. Electrical connection is provided through the insulation structure to selected locations of the conductive level. A further insulation structure is provided above the electrical connection.

In another aspect, the invention encompasses a process for fabricating the above disclosed semiconductor structure. More particularly, the process of the invention comprises providing a semiconductor substrate having a conductive level thereon. A layer of a first dielectric etch stop material is blanket deposited. The layer of the dielectric etch stop material and the conductive level are patterned, preferably by reactive ion etching, thereby creating structures including (i) a fuse structure capped with self-aligned dielectric etch stop material thereon and (ii) conductive lines, and gaps between the structures.

The process of the invention is preferably continued by depositing a second dielectric material, different from the etch stop material, over the structures and in the gaps. A third dielectric material is deposited over the second dielectric material. The third dielectric material, second dielectric material and first dielectric material are patterned, preferably by reactive ion etching, to create vias through the third dielectric material, second dielectric material and first dielectric material, thereby exposing selected portions of the conductive level. The vias are filled with electrically conductive material to provide electrical interconnection to the selected portions of the conductive level. A further insulating layer is provided over the entire structure, and then via is created through the insulating structure down to the etch stop layer on the fuse.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

FIGS. 1–5 illustrate the semiconductor structure of the present invention during various stages of preparation.

BEST AND VARIOUS MODES FOR CARRYING OUT INVENTION

In order to facilitate an understanding of the present invention, reference will be made to the figures which illustrate a diagrammatic representation of the steps of producing the semiconductor structure according to the present invention. Like numerals in different figures refer to the same component.

Figure 5:
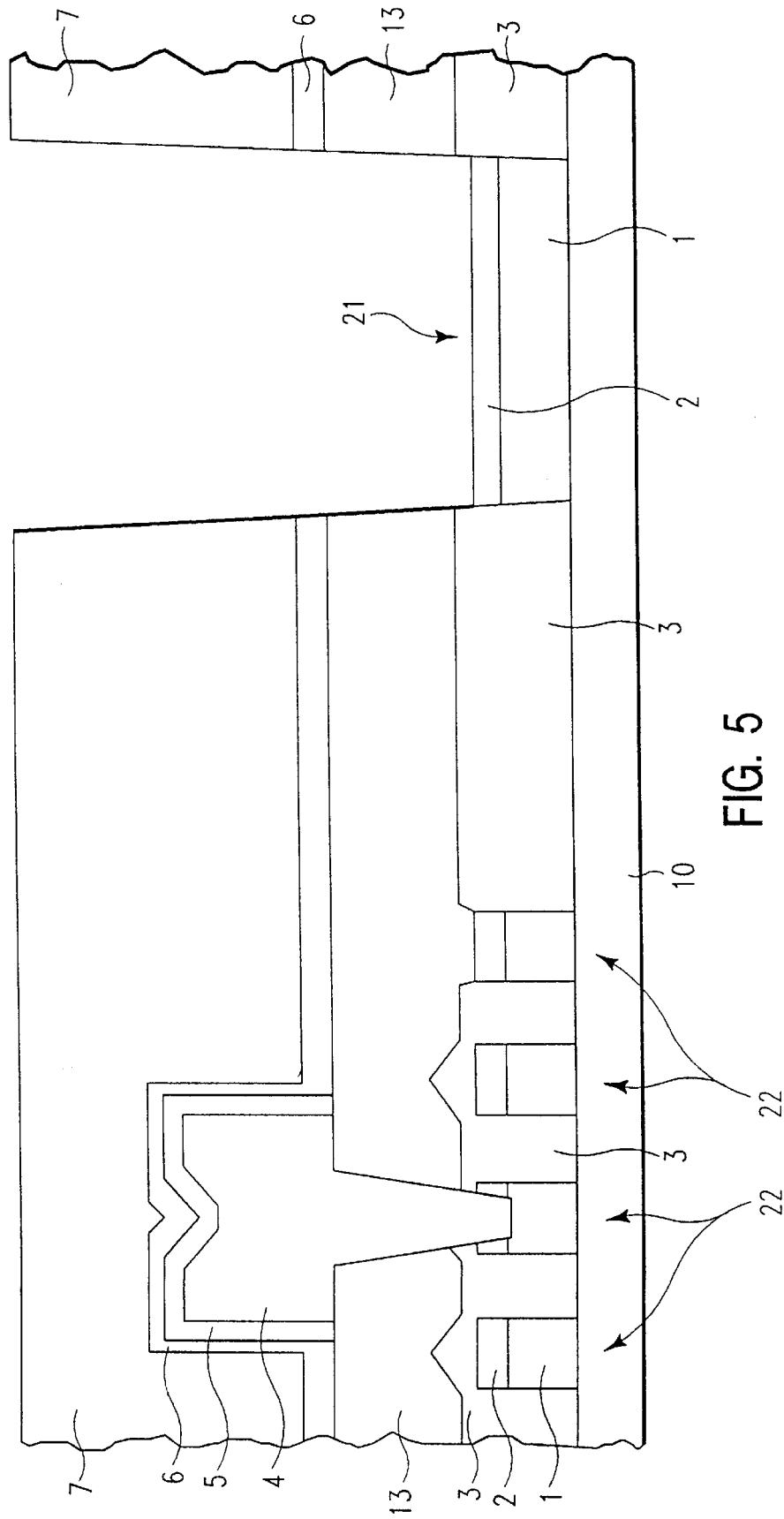

Referring to FIG. 5, the semiconductor structure of the invention preferably comprises a semiconductor substrate 10; an electrically conductive material at a level 1 on the substrate; a conductive fuse 21 located at the conductive level 1 wherein the fuse comprises a conductive segment of the level 1 conductive material with self-aligned dielectric etch stop layer 2 thereon; insulation structure 3 (optionally including additional insulating layer 13) located above the conductive level 1 and in between conductive lines 22 of the conductive level 1, but not above the fuse 21; and electrical interconnection 4 through the insulation structure 3 (and 13 if present) to selected locations of the conductive level 1. The structure of the invention preferably further comprises a further insulating structure shown as layers 5–7 over the electrical interconnection 4.

The structure of the invention is preferably made by the process of the invention which is described below in connection with FIGS. 1–5. According to the process of the invention, a semiconductor substrate structure 10 is provided with an electrically conductive layer 1 (also referred to as level 1). The conductive layer 1 is preferably formed from a conductive material selected from the group consisting of aluminum, copper, aluminum copper alloys, and doped polysilicon having metallic-type conductivity. The electrically conductive level 1 may be a wiring level or gate conductor level and may be formed by any technique normally used to form those conductive levels. Layer 1 is preferably about 50 to 1000 nanometers thick, more preferably about 200 to 500 nanometers thick. A layer 2 of a dielectric etch stop material is blanket deposited on top of layer 1. The layer 2 is preferably a silicon nitride and/or silicon oxynitride. The silicon nitride and/or silicon oxynitride can be provided by chemical vapor deposition (CVD) or other known technique. The maximum thickness of layer 2 is preferably about 450 nanometers. Layer 2 is more preferably about 25 to 200 nanometers thick, more preferably about 50 to 100 nanometers thick, a typical example being about 50 nanometers. In addition, if desired, a silicon dioxide layer (not shown) can also be present as a component of layer 2 above the silicon nitride and/or silicon oxynitride layer.

The dielectric etch stop material layer 2 and the conductive layer 1 are patterned, preferably by reactive ion etching (RIE). During RIE process, the substrate is electrically biased in a chamber that has a plasma of gases made up of a reactive component (e.g. fluorinated hydrocarbon) and an inert gas. The plasma reacts with the layers to produce volatile reaction products that get pumped away from the chamber. If the desired pattern is coarse, then wet chemical etching may be used as an alternative to reactive ion etching. When the desired sections of the dielectric layer 2 have been removed, the etching conditions may be altered to conditions more suitable for reactive ion etching of metals where the patterned etch stop material acts as a hard mask patterning the conductive features.

As shown in FIG. 2, the patterning step results in the creation of one or more fuses 21 capped with self-aligned dielectric etch stop material. The patterning also typically results in the formation of other conductive features such as conductive lines 22 and gaps 20 located between the conductive lines 22. The fuses 21 capped by the self-aligned dielectric material are formed prior to providing the next level dielectric material and while there is essentially no material between the conductive lines 21.

Figure 3:
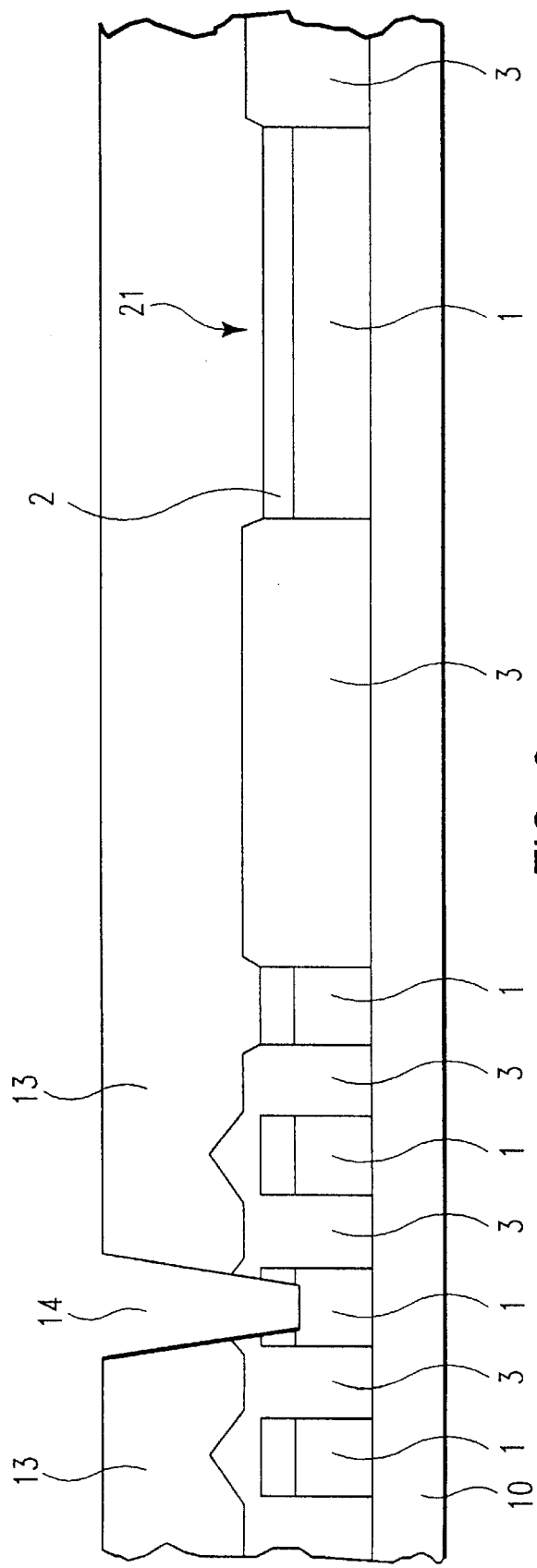

Next, as shown in FIG. 3, a second dielectric material 3, different from the etch stop material, is deposited in the gaps 20 and over the remaining dielectric etch stop material. Preferably, the second dielectric material 3 is a relatively dense silicon dioxide material provided by using high density plasma enhanced chemical vapor deposition or other technique. Preferably, the thickness of layer 3 above layer 2 is about 40 to 400 nanometers, more preferably about 50 to 200 nanometers.

Next, a third dielectric layer 13 such as silicon oxide from chemical vapor deposition of tetraethylorthosilicate (TEOS) or a silane may be provided. Preferably, layer 13 is about 50 to 1000 nanometers thick, and more preferably about 200 to 400 nanometers thick. In some instances, it may be possible to omit the deposition of silane-derived or TEOS derived silicon oxide if oxide layer 3 is of sufficient thickness.

Next, the uppermost dielectric layer 3 (or 13 if present) is then preferably planarized using chemical mechanical polishing or other appropriate technique. The combined thickness of layers 2, 3 and 13 is preferably about 350 to 1200 nanometers. The dielectric layers 3 and 13 are then patterned to provide vias 14 to selected conductive lines 22 and/or other features remaining from conductive layer 1. This patterning can be carried out by reactive ion etching or other suitable technique. A resulting structure is shown in FIG. 3.

Figure 4:
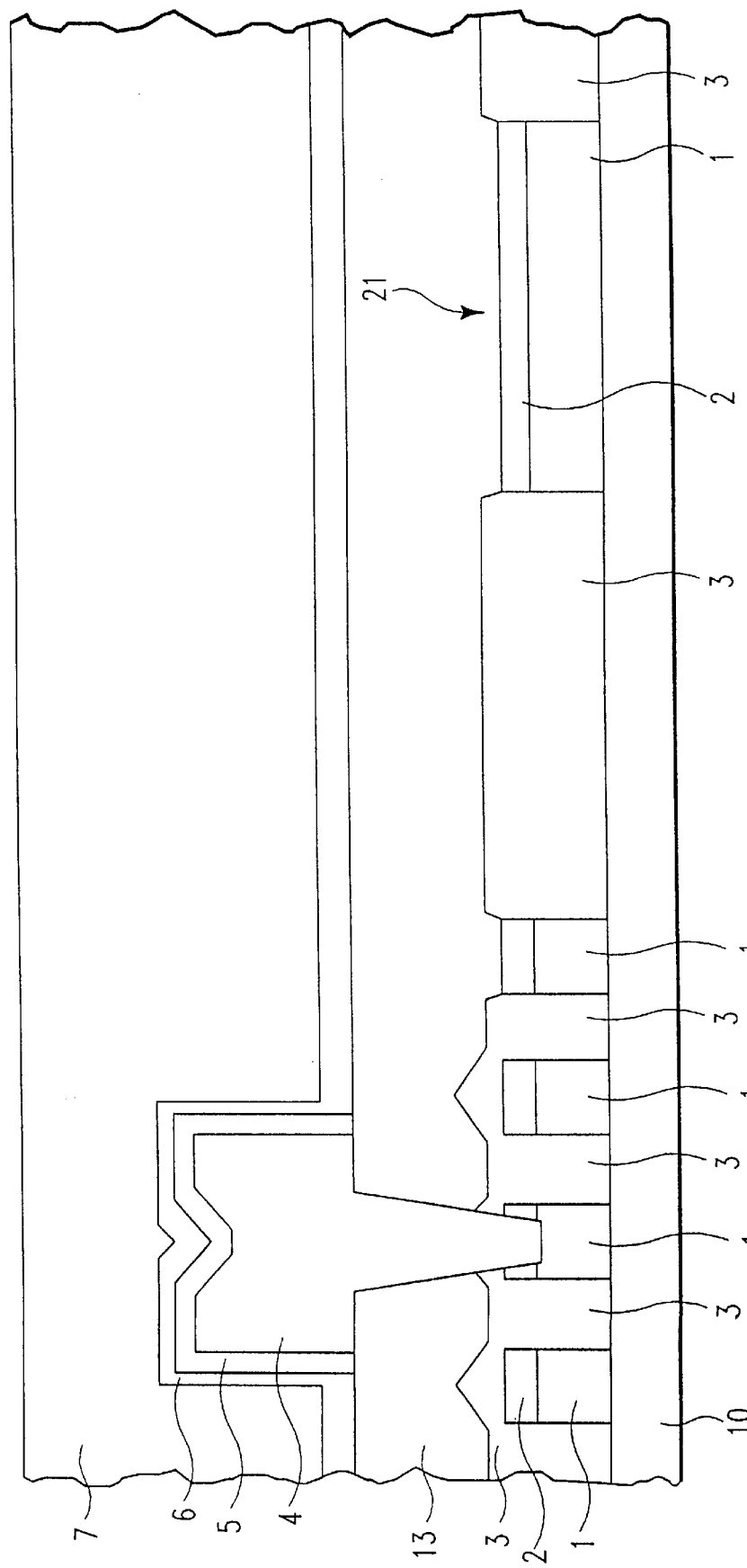

As illustrated in FIG. 4, a conductive material, such as aluminum, tungsten, titanium, tantalum, or heavily doped polysilicon, is then provided in the vias to provide electrical connection to the underlying conductive feature (e.g. a line 22). A portion of conductive material is also provided above the isolation layer 13 and is patterned, using reactive ion etching or other known technique, thereby resulting in the electrical interconnection structure 4.

Further dielectric isolation preferably then provided as shown in FIG. 4. For example, a dielectric layer 5 such as silicon dioxide obtained from depositing TEOS. This layer 5 is preferably about 100 to 1000 nanometers thick and more preferably about 200 to 600 nanometers thick. Another layer 6 of silicon nitride may then be provided by chemical vapor deposition above the TEOS-derived layer 5. This layer 6 is preferably about 100 to 1000 nanometers thick, more preferably about 200 to 600 nanometers thick. Preferably, a layer 7 of, for example, photosensitive polyimide is then deposited over layer 6. Layer 7 may be deposited by spraying or spin coating and is preferably about 2 to 10 micrometers thick.

As shown in FIG. 5, layer 7 is patterned by known lithographic techniques and acts as an etch mask for selectively etching the various dielectric layers above the fuse 21 dielectric etch stop. More particularly, the selective etching is preferably achieved by reactive ion etching. For example, nitride layer 6 and oxide layer 5 may be etched using a fluorinated hydrocarbon (e.g., $C_4F_8$) at about 5 to 15 sccm (typically about 8 sccm) and an inert gas (e.g., argon) at about 50 to 100 sccm (typically about 100 sccm). After this, the flow rate of the fluorinated hydrocarbon and inert gas may be adjusted, to about 5 to 15 sccm (typically about 8 sccm) and about 10 to 25 sccm typically about 15 sccm), respectively, in order to etch the underlying silicon oxide layers 3 and 13 while removing at most only very small amounts of underlying nitride-containing etch stop material layer 2 which is the cap for the fuse 21.

The process of the invention advantageously produces fuses having a controlled thickness insulting layer which provides the design and performance advantages mentioned above.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A semiconductor structure comprising a semiconductor substrate; an electrically conductive level on said substrate; a conductive fuse located at said conductive level wherein said fuse comprises a self-aligned dielectric etch stop layer thereon; insulation structure located above said conductive level and in between metal lines of said conductive level but not above said fuse; and electrical interconnection to selected locations of said conductive level.

2. The semiconductor structure of claim 1 wherein said dielectric etch stop layer comprises silicon nitride.

3. The semiconductor structure of claim 1 wherein said dielectric etch stop layer comprises silicon oxynitride.

4. The semiconductor structure of claim 1 wherein said self-aligned dielectric etch stop layer has a maximum thickness of about 450 nanometers.

5. The semiconductor structure of claim 1 wherein said self-aligned dielectric etch stop layer has a thickness of about 25 to 200 nanometers.

6. The semiconductor structure of claim 1 wherein said insulation layer comprises a first layer of plasma enhanced CVD silicon dioxide and a second layer of silicon oxide derived from a silane or tetraethylorthosilicate.

7. The semiconductor structure of claim 1 which further includes insulating structure above said electrical interconnection.

8. The semiconductor structure of claim 7 wherein said insulating structure above said electrical interconnection comprises a layer of silicon dioxide, and a layer of silicon nitride located above said layer of silicon dioxide.

9. The semiconductor structure of claim 8 which further includes a photosensitive polyimide layer above said silicon nitride.

* * * * *

UNITED STATES PATENT AND TRADEMARK OFFICE
CERTIFICATE OF CORRECTION

PATENT NO. : 6,037,648
DATED : March 14, 2000
INVENTOR(S): Kenneth C. Arndt et al.

It is certified that error appears in the above-identified patent and that said Letters Patent is hereby corrected as shown below:

```
Title page, Item [75], the residence of the first named
inventor    should   read    ---Fishkill,   N.Y.---.
```

Signed and Sealed this

Third Day of April, 2001

*Attest:*

NICHOLAS P. GODICI

*Attesting Officer*  *Acting Director of the United States Patent and Trademark Office*